(12) United States Patent
Uchida et al.

(10) Patent No.: US 7,149,376 B2
(45) Date of Patent: Dec. 12, 2006

(54) EMBEDDED OPTICAL COUPLING IN CIRCUIT BOARDS

(75) Inventors: Toshi K. Uchida, Rancho Palos Verdes, CA (US); Masataka Ito, Torrance, CA (US)

(73) Assignee: Ibiden Co., Ltd., Ogaki (JP)

( * ) Notice: Subject to any disclaimer, the term of this patent is extended or adjusted under 35 U.S.C. 154(b) by 117 days.

(21) Appl. No.: 10/814,011

(22) Filed: Mar. 31, 2004

(65) Prior Publication Data

US 2004/0264838 A1 Dec. 30, 2004

Related U.S. Application Data

(63) Continuation-in-part of application No. 10/230,141, filed on Aug. 27, 2002, now abandoned.

(51) Int. Cl.
G02B 6/26 (2006.01)
(52) U.S. Cl. .............. 385/15; 385/47; 385/48; 385/49
(58) Field of Classification Search ........... 385/47–49, 385/15
See application file for complete search history.

(56) References Cited

U.S. PATENT DOCUMENTS

| | | | |
|---|---|---|---|
| 3,777,154 A | 12/1973 | Lindsey | |
| 4,732,446 A * | 3/1988 | Gipson et al. | 385/24 |
| 4,966,430 A * | 10/1990 | Weidel | 385/14 |
| 5,600,741 A * | 2/1997 | Hauer et al. | 385/35 |
| 5,764,832 A * | 6/1998 | Tabuchi | 385/49 |
| 5,786,925 A * | 7/1998 | Goossen et al. | 359/245 |
| 6,233,376 B1 | 5/2001 | Updegrove | |
| 6,257,771 B1 | 7/2001 | Okayasu | |
| 6,330,377 B1 * | 12/2001 | Kosemura | 385/14 |
| 6,427,034 B1 | 7/2002 | Meis et al. | |
| 6,439,895 B1 | 8/2002 | Li | |
| 6,457,875 B1 * | 10/2002 | Kropp et al. | 385/89 |
| 6,512,861 B1 * | 1/2003 | Chakravorty et al. | 385/14 |
| 6,869,229 B1 * | 3/2005 | Reedy et al. | 385/88 |
| 6,912,341 B1 * | 6/2005 | Tietjen | 385/26 |
| 6,944,377 B1 * | 9/2005 | Umebayshi et al. | 385/49 |
| 2002/0176671 A1 | 11/2002 | Tourne | |
| 2004/0022496 A1* | 2/2004 | Lam | 385/49 |
| 2004/0042705 A1* | 3/2004 | Uchida et al. | 385/14 |

* cited by examiner

*Primary Examiner*—John D. Lee
*Assistant Examiner*—Rhonda S. Peace
(74) *Attorney, Agent, or Firm*—Oblon, Spivak, McClelland, Maier & Neustadt, P.C.

(57) ABSTRACT

A circuit board has embedded optical fibers terminating in fiber ends which face into holes defined in the circuit board and optoelectronic emitter or detector modules mounted in the holes in optical coupling with the fiber ends. Each module is electrically connected to circuit traces on the circuit board and is optically coupled to one or more optical fibers terminating on a side surface of the hole. The modules have an optical axis oriented into the hole and a reflector supported in the hole for optically coupling the photo emitter/detector module with the fiber ends on the side surface of the hole.

92 Claims, 5 Drawing Sheets

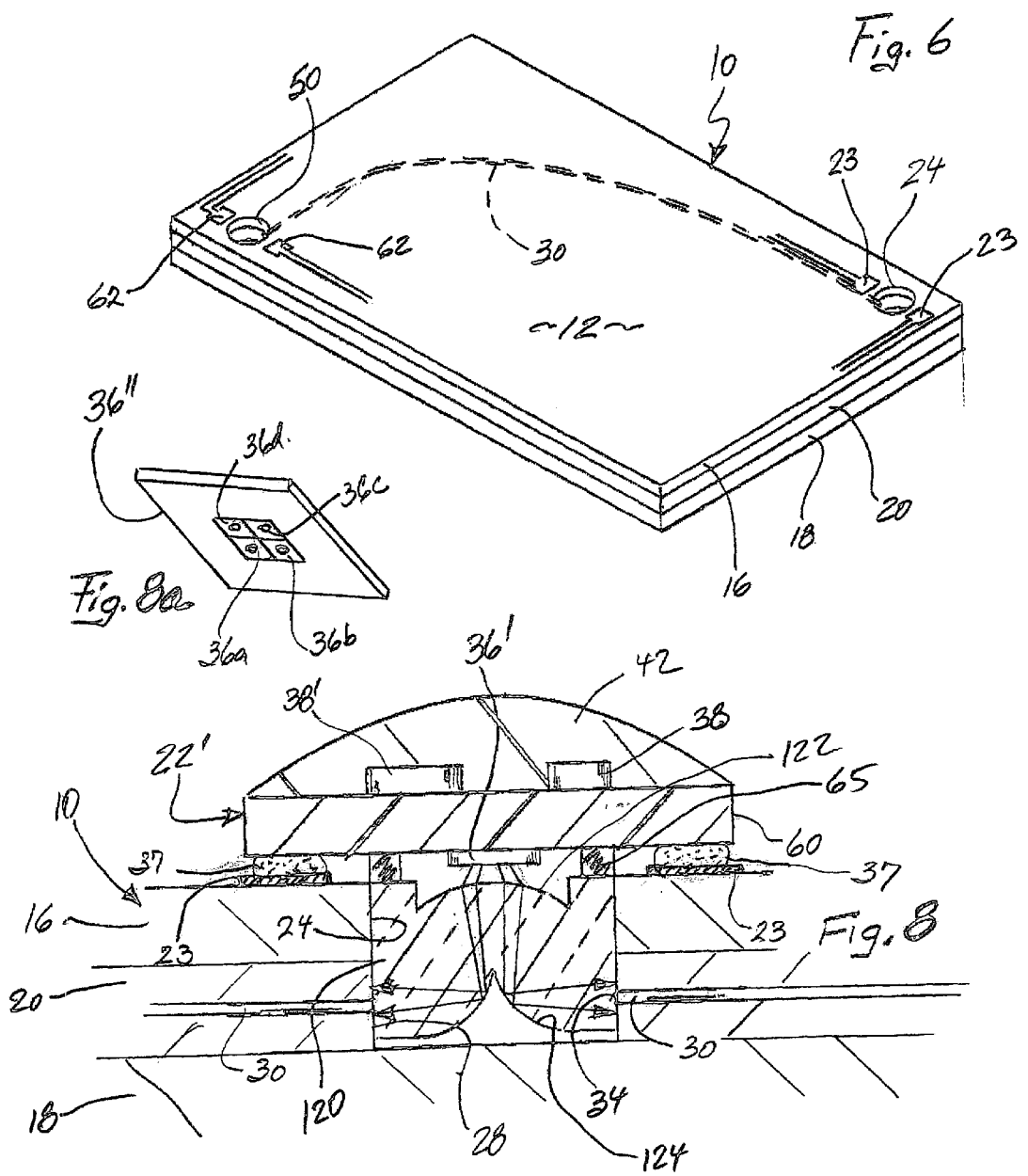

EMBEDDED OPTICAL COUPLING IN CIRCUIT BOARDS

This is a continuation-in-part of application Ser. No.10/230,141 filed Aug.27,2002 now abandoned.

BACKGROUND OF THE INVENTION

1. Field of the Invention

This invention pertains to the field of electronic circuit boards used for interconnecting electronic components into functional subassemblies, and more specifically is directed to circuit boards having conventional single or multi-layer conductive traces in combination with an optical fiber interconnect layer embedded between layers of the circuit board.

2. State of the Prior Art

The rapid increase in data transmission and data processing rates brought about by broadband communications and interactive telecommunication and computer services creates a need for increased interconnection density and capacity in electronic equipment. This need has led to a growing reliance upon optical fiber as a replacement for traditional wire transmission lines, and has resulted in the almost complete replacement of copper wire with optical fiber for long distance transmission because of lower transmission losses and superior bandwidth characteristics. Optical fiber transmission can also improve system performance if applied at short distances, as between physically adjacent equipment racks and cabinets, or between offices in a given building. However, the benefits of optical fiber transmission extend to even shorter distances, as at intra-board level among integrated circuits and other components on a single circuit board, and at the intra-module level for interconnecting for example very large scale (VLSI) and ultra large scale (ULSI) integrated circuits and chip subassemblies in a single electronic module operating at Gigabyte speeds.

Advantages of optical interconnects over electrical conductors at the board and module level include immunity to electromagnetic interference (EMI) or electrical noise, electrical isolation of interconnected components, far less frequency dependent signal degradation, and higher possible density of interconnects due to lack of cross-talk between closely spaced, fine conductors.

Current efforts at providing optical Interconnects at the circuit board level are exemplified by optical flex technology such as the Optical Flex circuitry marketed by Advanced Interconnection Technology, LLC of Islip, N.Y. and the optical flex foil developed under the Apollo Demonstrator project at the Micro Interconnect Research Center of L M Ericsson, Stockholm, Sweden and described in Ericsson review, No. 2, 1995, vol. 72. In general these optical interconnects involve arranging lengths of optical fibers in a desired pattern customized to the intended application, laminating the optical fibers between sheets of a flexible foil and applying appropriate connectors and terminations to the fiber ends. The lamination holds both the fibers and the connectors in the desired layout. The flex foil interconnect is assembled to a conventional rigid circuit board simply by plugging the connectors to corresponding mating connectors on the circuit board. Mechanical supports may be provided on the circuit board for stabilizing the flex foil in place rather than relying on the fiber connectors alone for this purpose. The flex foil is typically supported in spaced relationship above the electrical components on the board. The resulting assembly tends to be awkward, costly and less than fully reliable due to reliance upon optomechanical connectors and the need to mechanically assemble the optical flex foil to the circuit board.

It has been also suggested in the literature that the flex foil be laminated or bonded to rigid circuit board thereby to integrate optical and electrical interconnects. Even if so laminated, however, current fiber flex foil approaches to the application of optical interconnects at the circuit board level still call for the use of optical connectors and terminations of the fibers and in this regard fall short of true integration of optical and electrical board level interconnections. Furthermore, the laminated flex foil will typically interfere with free layout of electrical parts on the circuit board.

A continuing need exists for better integrated, lower cost and more reliable optical interconnects for electronic circuit boards.

SUMMARY OF THE INVENTION

This invention addresses the aforementioned need by providing a circuit board with integral optoelectronic connectivity, which includes a board having top and bottom surfaces and a plurality of board edges; optical fibers contained in the insulating material between the top and bottom surfaces, the optical fibers having fiber ends facing into holes defined in the insulating board; and optoelectronic emitter or detector elements mounted in the holes in optical coupling with the fiber ends.

Typically, the optoelectronic circuit board also has electronic circuit devices mounted to the board and electronically connected to the optoelectronic emitter or detector elements such that optical signal communication between the electronic circuit devices is established by way of the optical fibers.

More specifically, the holes each have a hole side surface between the top and bottom surfaces of the board and the fiber end face into the hole on the hole side surface so as to illuminate or be illuminated by a photo detector or emitter, respectively, mounted in the hole. The optical fiber ends in the holes terminate in a fiber end surface which, in one form of the invention, is transverse, and preferably perpendicular to the top and bottom surfaces of the circuit board and is also substantially flush with the hole side surface.

The photo emitter or detector elements mounted in the holes each have an optical axis transverse to the top and bottom surfaces of the circuit board and are mounted with the optical axis extending generally vertically into the hole relative to the board top and bottom surfaces, for radiating into or receiving illumination from the hole. The photo emitter/detector elements is each provided with a reflector positioned in the hole so as to place the photo emitter/detector elements in optical coupling with the fiber end surfaces facing into the hole from the hole side surface.

The optical coupling of the photo emitter/detector elements to the fiber ends in the holes may be diffuse scattered coupling, or the optical coupling may be through a convergent lens disposed for focusing light onto or from the fiber end faces in the holes, or in yet another case the optical coupling may be through a divergent lens disposed for illuminating multiple fiber end faces in a given hole.

In some cases the holes may extend only partially through the board and are open to only one of the top and bottom surfaces. In other cases the holes may extend fully through the board and are open to both the top and bottom surfaces.

The optical fibers of the optoelectronic board may be in the form of an optical interconnect layer which includes top and bottom sheets of electrically insulating material and an intermediate layer between the top and bottom sheets, the optical fibers being included in the intermediate layer. More specifically, the intermediate layer may include one or more fiber carrier sheets with the optical fibers laminated to the fiber carrier sheet or sheets, and the fiber sheets in turn embedded between the top and bottom sheets of electrically insulating material.

Typically, the optical fibers lie in a fiber plane located between and generally parallel to the top and bottom surfaces of the optoelectronic circuit board.

The optoelectronic circuit board may have one or more layers of alternating electrically conductive traces and insulating layers between the top and bottom surfaces of the board and above or below the intermediate layer containing the optical fibers, with through connections for electrically interconnecting electronic components on the board.

The optoelectronic circuit board of this invention includes a circuit board having top and bottom surfaces, at least one optical fiber contained in the board between the top and bottom surfaces, each optical fiber terminating in a fiber end facet on a side wall of a hole defined in one or both of the top and bottom surfaces; and an optical emitter or detector mounted on one of the surfaces and electrically connected to electrical conductors on the mounting surface, the optical emitter or detector having a first optical axis directed into the hole transversely to the mounting surface and a light reflector supported in the hole for reflecting the first optical axis towards the fiber end facet on the sidewall of the hole.

In one form of the invention the optical emitter or detector and the reflector are assembled to each other for mounting as an optoelectronic module to the circuit board. For example, the optoelectronic module can be mounted to a surface of the board with the reflector suspended in the hole.

The reflector may be configured for reflecting the optical axis generally omni directionally about the first optical axis of the optical emitter or detector. For example, the reflector can be a reflecting surface of revolution about the first optical axis.

The reflector and the optical emitter or detector can be assembled to a plug body sized and shaped to fit in the hole such that the reflector is positioned in optical alignment with the fiber facet. In a presently preferred embodiment, the plug body is of light transmitting material and the reflector is an internally reflecting surface of the plug body. The plug body may also define a lens between the reflector and the emitter or detector, for example for condensing or dispersing light.

The circuit board may have a number of optical fibers terminating in multiple fiber end facets spaced on the side wall of a given hole, with the reflector being arranged and configured for reflecting the optical axis onto all of the fiber end facets on the side wall.

The invention also extends to an optoelectronic module having an optical device for emitting or detecting a light signal along a first optical path, an electronic circuit connected for supplying a drive signal to the optical device or for receiving a signal detected by said optical device, and an optical reflector for reflecting the light signal between the first optical path and a second optical path generally transverse to the first optical path. Preferably the optical device, electronic circuit and optical reflector are assembled for mounting as a unit or module to a main circuit board. In one embodiment the first optical path is directed into a hole in the main circuit board in a mounted condition of the module and the optical reflector is arranged for directing the second optical path towards a side wall of the hole.

In one form of the invention the optoelectronic module has a substrate, and the optical device, electronic circuit and optical reflector are mounted to the substrate. The substrate may be a printed circuit electrically interconnecting and physically supporting the electronic circuit and the optical device.

The substrate may have electrical contacts, such as on the underside of the substrate, for mounting and interconnecting the optoelectronic module to the optoelectronic circuit board, as by surface mounting of the assembly to the circuit board. The electronic circuits can be mounted to a top side of the substrate and the optical device mounted to the substrate such that the first optical axis is substantially perpendicular to the circuit board.

The optical reflector of the optoelectronic module may take different forms such as a plane reflector, a concave reflector, a convex reflector, a conical reflector, a paraboloid of revolution reflector, or a pyramidal reflector, for example.

The optical device of the optoelectronic module may include an array of one or more light emitters such as one or more laser diodes, or an array of one or more light detectors such as one or more photodiodes.

One or more optical lenses may be interposed between the optical device and the optical reflector of the optoelectronic module. The lens may be convergent or divergent and the lens or lenses may be formed with the optical reflector as part of a unitary optical element of light transmitting material. For example, the unitary optical element may have a lenticular top surface and an internally reflecting bottom surface. The unitary optical element may be a plug body shaped to make a close fit in the circuit board.

This invention also includes a method of making an optoelectronic circuit board comprising the steps of embedding an optical fiber between top and bottom surfaces of a circuit board and making a hole in the board and through the optical fiber so as to cut the optical fiber to make at least one fiber end with a fiber end facet on a side wall of the hole. The method of this invention may also include the steps of mounting an optical emitter or detector to the circuit board with an optical axis directed into the hole and a reflector in the hole for reflecting the optical axis towards a fiber end facet on the side wall of the hole.

These and other improvements, features and advantages of this invention will be better understood by reference to the following detailed description and the accompanying drawings.

BRIEF DESCRIPTION OF THE DRAWINGS

FIG. 6 is a perspective view of an optoelectronic circuit board with an embedded optical fiber, suggested in dotted lining, terminates in fiber end facets on the side walls of two holes spaced apart on the circuit board;

FIG. 8 is an elevational cross-section of an alternate optoelectronic module having a reflector shaped as a paraboloid of revolution.

DETAILED DESCRIPTION OF THE PREFERRED EMBODIMENTS

Figure 1:
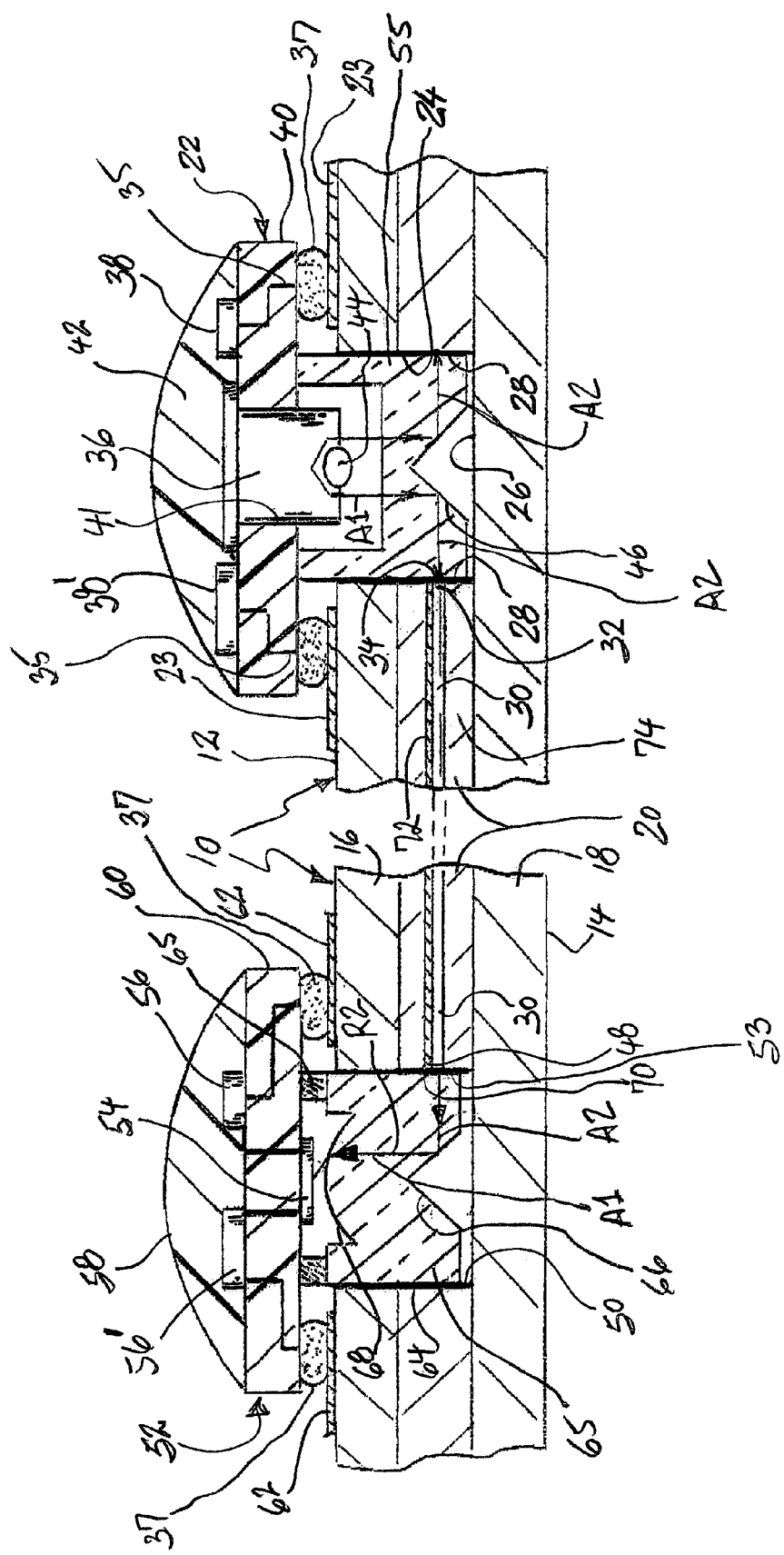
FIG. 1 is a fragmentary vertical cross section of an optoelectronic circuit board taken along the center axes of a photo emitter/detector pair mounted in corresponding holes and interconnected by an optical fiber embedded in the circuit board.
Figure 5:
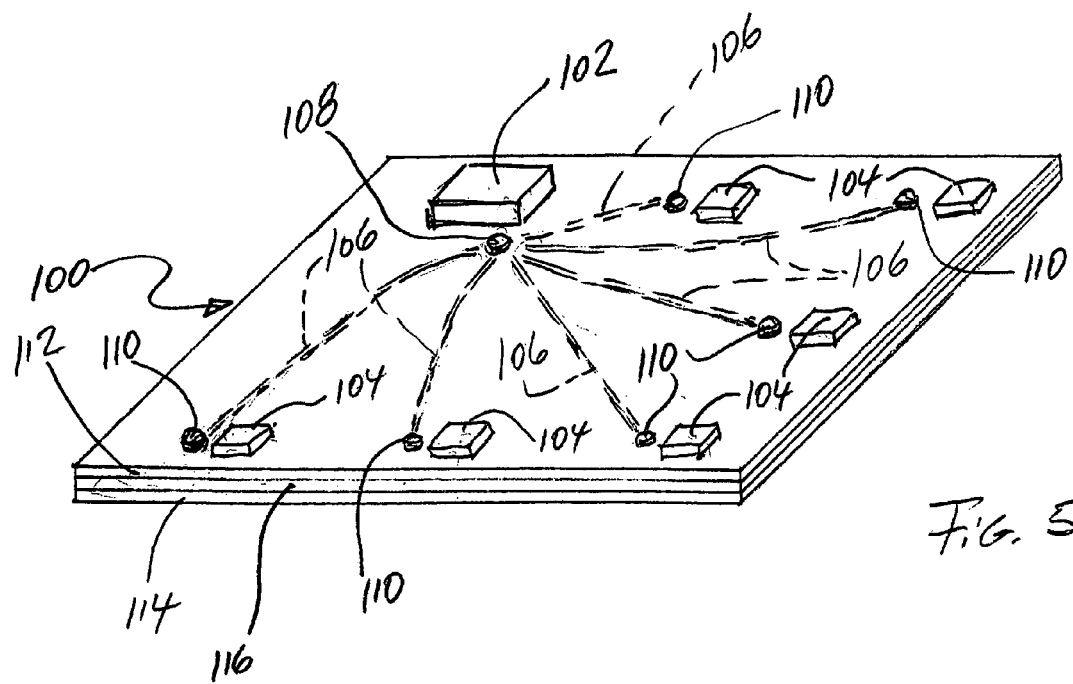
FIG. 5 is a perspective view of an exemplary circuit board with embedded optical interconnects for connecting a high speed microprocessor to multiple data memory modules on the board.

With reference to the accompanying drawings wherein like elements are designated by like numerals, FIG. 1 shows a circuit board 10 having a top surface 12 and a bottom surface 14. The board 10 has three layers including a top electrical layer 16, a bottom electrical layer 18 and an intermediate optical layer 20. The electrical layers 16, 18 may have conventional copper cladding on one or both sides, that is, on the exterior surfaces 12, 14 and also on interior surfaces facing the intermediate optical layer 20. The board 10 may have still more electrical layers, each with additional copper layers. The layers of copper cladding on the electrical layers may be etched or otherwise processed to define conductive trace patterns for electrically interconnecting electronic components mounted on either or both board surfaces 12, 14, and provided with suitable through-connectors (not shown) for making connections between the multiple conductive layers, all in a manner which is well understood in the electronics field. For simplicity and ease of description and illustration, a three layer board is shown in FIG. 1.

A photo emitter or transmitter module 22 is mounted on top surface 12 over a module receiving hole 24. The hole 24 is open to top surface 12 and has a hole bottom 26. The hole 24 also has a side wall surface 28, which may be cylindrical between the top surface 12 and bottom 26. An optical fiber 30 is embedded in the intermediate layer 20 in a plane generally parallel to top and bottom surfaces 12, 14. The fiber has a fiber end 32 which extends through the side wall surface 28 of hole 24 and has a fiber end surface or facet 34 which faces into the hole and may be approximately flush with the wall surface 28.

Figure 7:
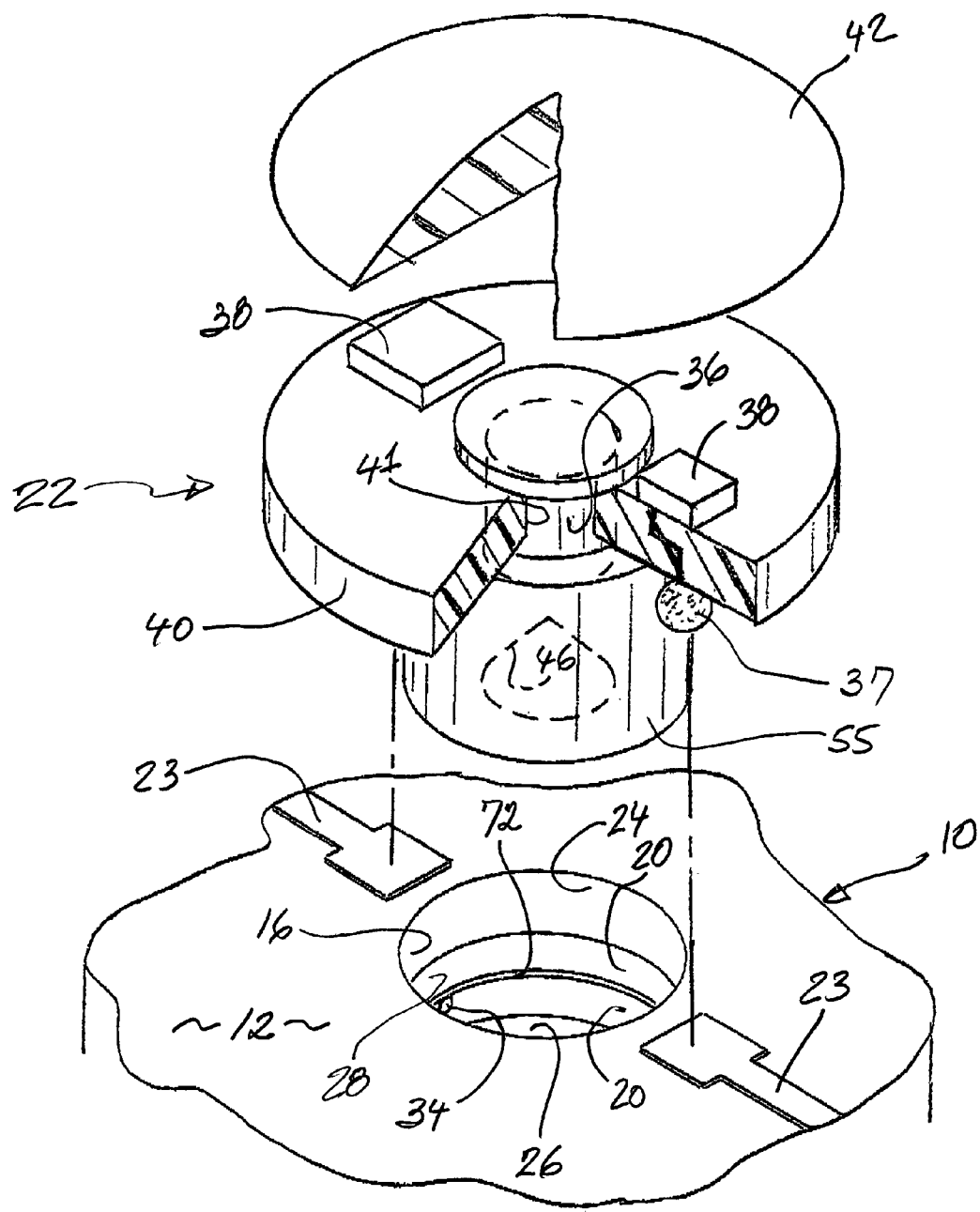
FIG. 7 is an exploded perspective view of an optoelectronic transmitter module shown in relation to a module receiving hole in a circuit board with an embedded optical fiber terminating in a fiber facet on the side wall of the hole.

The photo emitter module 22 includes a light source 36 such as a light emitting diode or laser diode, for example a commercially available SV3637 device, and a power control IC 38 such as a Maxim 3286 laser driver device and associated discrete components 38' connected for driving light source 36, on submount 40 and preferably encapsulated in a protective resin 42. The submount 40 may be a circuit board such as a disk of epoxy circuit board. The power control device 38 and any associated discrete components 38' such as capacitors or resistors are mounted on the submount 40, preferably on the top side of the submount. The light emitter device 36 is mounted with its active emitting surface facing downwardly from the submount, for example, by mounting the laser diode in a center hole 41 of the submount 40 as shown in FIGS. 1 and 7.

The photo emitter module 22 is electrically interconnected to the circuit board 10 by surface mount soldering at 37 to conductive traces 23 which supply the electrical drive signal containing the information to be transmitted by the optical fiber interconnect. The photo emitter module 22 converts the electrical drive signal to a light signal output carrying the information. The output of light source 36 is collimated by a convergent lens 44 onto a conical reflector surface 46 suspended from submount 40 in hole 24 along a vertical optical axis A1 centered in hole 24. Reflector surface 46 is at a 45 degree angle to the vertical optical axis of photo emitter module 22 resulting in a 90 degree angle of reflection of the light which is redirected radially outwardly along a horizontal optical axis A2 against the side wall surface 28 and onto the exposed end surface 34 of optical fiber 30. The conical reflector 46 in effect scatters the light output of emitter 22 radially to the vertical axis A1 of the reflector and more or less evenly in a circumferential direction around the cylindrical wall surface 28 of the hole. Because of this, two or more optical fibers terminating at the wall surface 28 and each having an end surface 34 facing into the hole 24 at circumferentially spaced locations about the wall surface can be illuminated simultaneously by photo emitter 22 as suggested by ray tracings A2. Some fraction of the light output of photo emitter 22 is received by fiber 30 and is transmitted along the length of the fiber. The fiber 30 on the left side of emitter module 22 runs horizontally within the intermediate layer 20 of the circuit board and terminates in an opposite fiber end 48 and fiber end surface 34 at hole 50. Circuit board hole 50 is similar to hole 24, and the two holes are spaced apart on circuit board 10 as shown in FIG. 6.

A photo detector or receiver module 52 is mounted over a second module receiving hole 50 in circuit board 10 as shown on the left hand side of FIG. 1, and includes a photo sensitive element 54 connected to a receiver IC 56 such as a Maxim 3866 amplifier and associated receiver circuit components 56', preferably encapsulated in resin 58 on submount 60, and surface mounted by soldering 37 to conductive traces 62 on top surface 12 of the circuit board 10. The photo detector 54 may be a commercially available device such as a KPID020 photo detector. The photo detector module 52 also has a unitary optical element in the form of a plug body 64 attached to the underside of submount 60 and suspended in hole 50. The plug body 64 is of clear material transparent to the light carried by fiber 30 and includes an internal reflecting surface 66, which may be conical and angled at 45 degrees. The top of the optical element 64 is convex and defines a focusing lens 68 under photo sensitive element 54.

Light carried by fiber 30 to fiber end 48 is emitted through fiber end facet 70 generally radially into hole 50 along horizontal optical axis A2 and onto reflecting surface 66 which redirects the received light upwardly along vertical optical axis A1, and convex lens 68 focuses the received light onto photo detector element 54 where the light is converted to an electrical output. This electrical output, carrying the original information of the electrical input to photo emitter 22, is amplified or otherwise processed by electronic receiver circuit 56, 56' and then transmitted from receiver module 52 via conductive traces 62 on top surface 12 of the circuit board 10 for further processing.

The optical fiber 30 will normally be one of many optical fibers in a practical circuit board 10. The optical fibers lie generally in a common plane approximately parallel to the top and bottom surfaces 12, 14 of the circuit board. Fabrication of the optoelectronic board is facilitated by first laminating the optical fiber 30, and any other fibers of circuit board 10, to one or more flexible carrier sheets or fibersheets 72 in the desired layout pattern. The fibersheet 72 with the laminated optical fibers is then encapsulated or embedded in a layer of suitable material such as a plastic or epoxy 74 to form the intermediate optical layer 20.

The module receiving holes 24, 50 can be made by mechanical drilling of the circuit board or by laser drilling or by any other suitable method.

Since the transmission distances on a circuit board are short, relatively loose optical coupling between the fiber end faces and the photo emitter/detector elements is normally sufficient. For this same reason it is not critical that the end faces of the optical fibers be polished to a high degree and scattered light directed toward the optical fiber end face will typically deliver sufficient radiation to the fiber core for effective transmission of the optical signal. Similarly, diffuse light emitted at the receiver end of the optical fiber and generally directed onto the photo detector element 54 will normally produce a sufficient electrical output signal from detector module 52. Transmission of the optical signal is facilitated by use of larger diameter multi mode (MM) optical fiber as the fibers 30 of the circuit board 10, in that multi mode fiber is considerably less demanding than single mode fiber in its degree of coupling to the light emitter/detector elements. The quality of the end surface or facet 34, 70 of the optical fiber 30 can be improved by application of a coating, such as an index matching gel which is commercially available from the Dupont or the Corning companies, among other sources. The facet, which may be somewhat rough as a result of the drilling process, is smoothed by application of the coating thereby enhancing the admission and emission of light in and out of the optical fiber. The facet coating also serves to protect the fiber end surface against oxidation and other processes which would tend to damage or degrade the facet surface.

Figure 2:
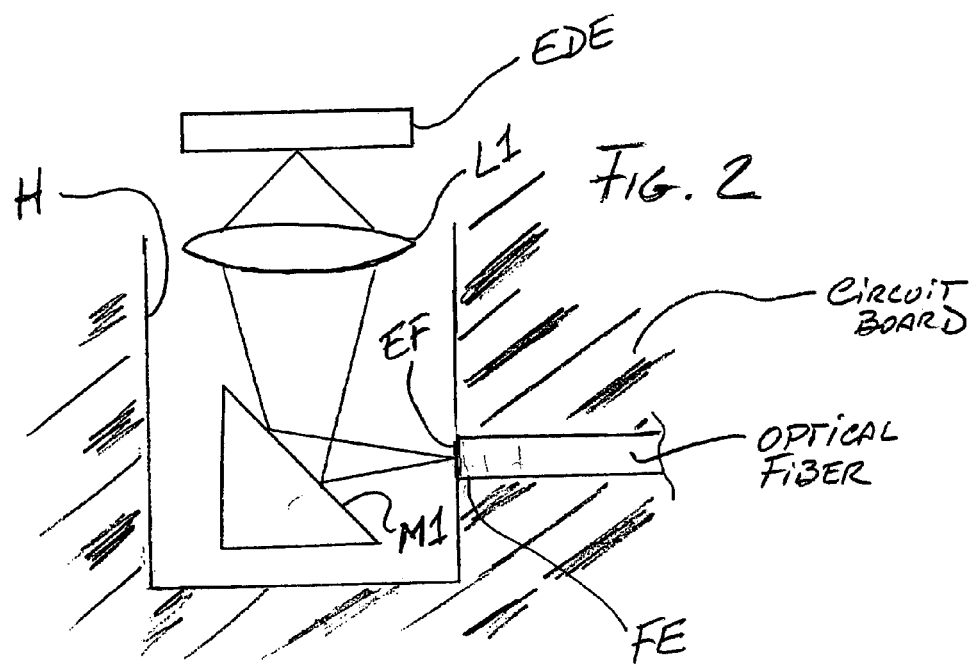
FIG. 2 is a ray trace diagram of a typical photo emitter/receiver mounted for illuminating an the end surface of an embedded optical fiber in a hole in the circuit board.

FIG. 2a shows a ray trace diagram of one form of optical coupling of the fiber end FE to a photo emitter/detector element EDE in a hole H of the optoelectronic circuit board. A convergent lens L1 is used in this example in combination with a flat 45 degree mirror surface M1 for focusing the light signal on both the photo emitter/detector element and the end face EF of the optical fiber for efficient coupling. It should be understood that the coupling optics can be arranged and configured in different ways to either tightly focus onto the end face of the fiber or to diffuse the focus over a larger area of the hole's side wall so as to cover the end faces of more than one fiber end facing into the same hole, for example by use of a divergent lens in place of the convergent lens L1.

Figure 3:
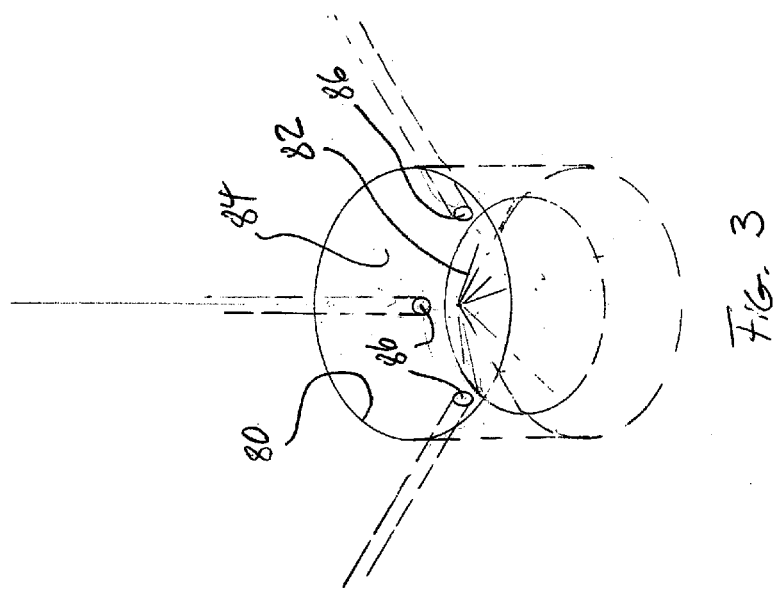
FIG. 3 is a perspective view partly in phantom lining depicting multiple optical fiber ends facing into a common hole in the circuit board.
Figure 4:
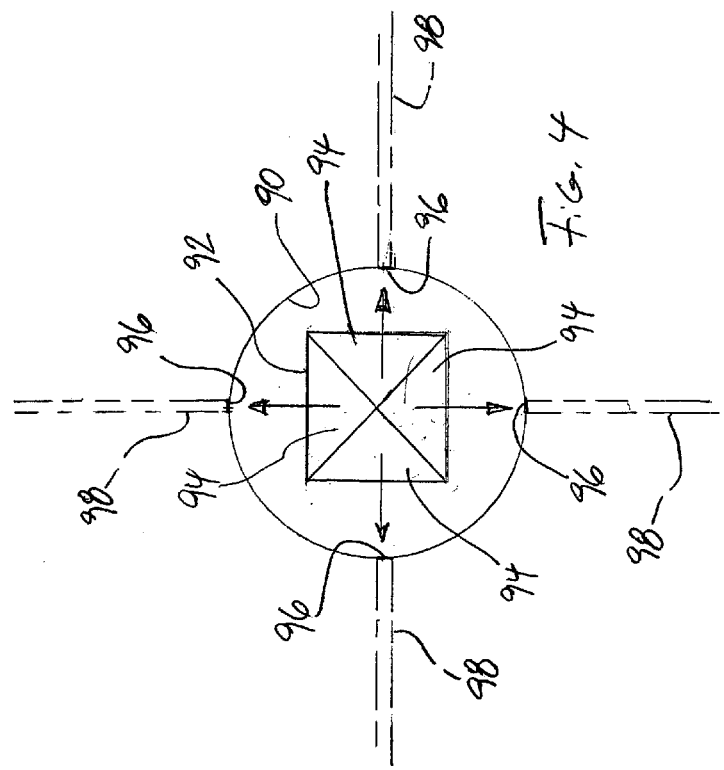
FIG. 4 is a top plan view of the hole of FIG. 3 showing a conical mirror arranged for illuminating the multiple optical fiber ends.

Multiple optical fibers may be terminated in a single hole, as depicted for example in FIGS. 3 and 4. In FIG. 3 a conical reflector 82 in the hole 80 disperses light circumferentially onto the cylindrical side wall 84 of the hole and illuminates the three circumferentially spaced fiber end faces 86 in the hole. In FIG. 4 a four faced pyramidal reflector 92 in hole 90 provides four flat reflecting surfaces 94 each positioned for optically coupling a corresponding one of four optical fiber end faces 96 of embedded optical fibers 98 to a photo emitter/detector mounted above the reflector 92. The flat faces of the polygonal pyramid offer somewhat better coupling efficiency over a circular conical surface.

FIG. 8 shows a transmitter module 22' which differs from the previously described photo emitter module 22 of FIG. 1 in that the optical reflector 124 is a paraboloid of revolution, that is, the radial cross section of the surface defines a parabola connecting the center axis of the reflector to the side wall 28 of hole 24. The parabolic curvature of reflector 124 is useful in dispersing the light focused by convergent lens 122 as suggested by ray lines A3, A4 in FIG. 8. Lens 122 condenses the light output of the light emitter 36' onto the reflector 124 which in turn disperses the convergent light rays A3 into divergent light rays A4. The optics of module 22' can be adjusted to provide a desired degree of light coverage of hole side wall 24.

The photo emitter device 36, 36' of the optoelectronic transmitter module 22, 22' may include an array of more than one light emitters such as multiple laser diodes for greater light signal output. For example, FIG. 8a illustrates a semiconductor chip 36" carrying an array of four laser diodes 36a–d. Likewise, the photo detector device 54 of the optoelectronic receiver module 52 may include an array of more than one photo detectors such as multiple photodiodes for improved sensitivity. In the case of either transmitter or receiver module the use of such emitter or detector arrays, respectively, can facilitate optical alignment of the module relative to the optical fiber or fibers in the circuit board hole.

This invention also includes a method of making an optoelectronic circuit board by embedding an optical fiber between top and bottom surfaces of a circuit board and making a hole in the board and through the embedded optical fiber so that the hole cuts the optical fiber to provide at least one optical fiber end facet on a side wall of the hole. The circuit board 12 is fabricated with electrical layers 16, 18 having conductive circuit traces 23, 62 and one or more optical layers 20 having embedded optical fibers 30. The embedded optical fiber 30 is interfaced to electrical circuits 23, 62 on the same circuit board 12 by installing optoelectronic transmitter and receiver modules 22, 52 in circuit board holes 28, 50 interconnected by the embedded optical fiber 30, as illustrated in FIG. 6 of the drawings.

The mounting holes for optoelectronic transmitter/receiver modules are cut or drilled in the circuit board 12 by any suitable means such as mechanical drilling or laser cutting. Optoelectronic transmitter/receiver modules are then installed in the appropriate holes as soldered or otherwise electrically connected to circuits 23, 62 as needed to complete the required signal paths between the conductive circuits and optical links.

An example of an optoelectronic circuit board with embedded optical connectivity according to this invention is shown in FIG. 4. In this example the circuit board 100 supports a microprocessor 102 and a number of solid state memory modules 104. Microprocessor 102 outputs a high speed clock signal to synchronous memory modules 104. The high speed clock signal is transmitted to each memory module by a separate optical fiber link 106 embedded in the circuit board in the manner described in connection with FIG. 1. The circuit board 100 has three layers including top and bottom electrical layers 112, 114 respectively and intermediate optical layer 116 containing the optical fibers 106. The optical fiber links 106 are all driven by one common light source 108 arranged in the manner suggested in either FIG. 3 or 4, with a circular or polygonal conical reflector for illuminating the several fibers 106 with a common light source. Each optical fiber 106 drives a receiver module 108 adjacent to a corresponding one of the memory modules 104. Electrical connections complete the path from the receiver modules 110 to the respective memory modules 104. The use of embedded optical connections 106 in optoelectronic circuit board 100 greatly reduces the number of traces and the complexity of the electrical layers of the circuit board and also minimizes radiation of high frequency EMI which would be caused by long conductors carrying the clock frequency throughout the board.

While a preferred embodiment and variants thereof have been described and illustrated for purposed of clarity and example, it will be understood that still other changes, modifications and substitutions will be apparent to those having only ordinary skill in the art without thereby depart-

What is claimed is:

1. An optoelectronic module comprising:
   an optical device configured to emit or detect a light signal along a first optical path;
   an electronic circuit connected to supply a drive signal to said optical device or to receive a signal detected by said optical device; and
   an optical reflector configured to redirect said light signal substantially radially about said first optical path along a second optical path substantially transverse to said first optical path,
   wherein said optical device, electronic circuit and optical reflector are assembled so as to be mounted as a unit to a main circuit board, and said optical reflector is a concave reflector.

2. The optoelectronic module of claim 1, wherein said optical device comprises one or more light emitters.

3. The optoelectronic module of claim 2, wherein said one or more light emitters comprises one or more laser diodes.

4. The optoelectronic module of claim 1, wherein said optical device comprises an array of light emitters or light detectors.

5. The optoelectronic module of claim 1, wherein said optical device comprises one or more photodiodes.

6. The optoelectronic module of claim 1, further comprising one or more optical lenses interposed between said optical device and said optical reflector.

7. The optoelectronic module of claim 6 wherein said one or more optical lenses comprise a convergent lens.

8. The optoelectronic module of claim 6 wherein said one or more optical lenses comprise a divergent lens.

9. The optoelectronic module of claim 6 wherein said one or more optical lenses and said optical reflector are formed as different surfaces of a unitary optical element of light transmitting material.

10. The optoelectronic module of claim 9 wherein said unitary optical element has a lenticular top surface and an internally reflecting bottom surface.

11. The optoelectronic module of claim 1, wherein said first optical path is directed so as to enter a hole in said main circuit board in a mounted condition of said unit and said optical reflector is arranged so as to direct said second optical path towards a side wall of said hole.

12. The assembly of claim 1, further comprising a substrate to which said optical device, electronic circuit and optical reflector are mounted.

13. The optoelectronic module of claim 12, wherein said substrate comprises a printed circuit interconnecting said electronic circuit and said optical device.

14. The optoelectronic module of claim 12, further comprising electrical contacts disposed on said substrate to mount and interconnect to a main circuit board.

15. The optoelectronic module of claim 14, wherein said electrical contacts are on an underside of said substrate.

16. The optoelectronic module of claim 15, wherein said electrical contacts are configured to surface-mount said unit to the said main circuit board.

17. The optoelectronic module of claim 12, wherein said electronic circuit is mounted to a top of said substrate.

18. The optoelectronic module of claim 12, wherein said substrate is a circuit board and said first optical axis is substantially perpendicular to said circuit board.

19. An optoelectronic module comprising:
   an optical device configured to emit or detect a light signal along a first optical path;
   an electronic circuit connected to supply a drive signal to said optical device or to receive a signal detected by said optical device; and
   an optical reflector configured to redirect said light signal substantially radially about said first optical path along a second optical path substantially transverse to said first optical path,
   wherein said optical device, electronic circuit and optical reflector are assembled so as to be mounted as a unit to a main circuit board, and said optical reflector is a convex reflector.

20. The optoelectronic module of claim 19, wherein said optical device comprises one or more light emitters.

21. The optoelectronic module of claim 20, wherein said one or more light emitters comprises one or more laser diodes.

22. The optoelectronic module of claim 19, wherein said optical device comprises an array of light emitters or light detectors.

23. The optoelectronic module of claim 19, wherein said optical device comprises one or more photodiodes.

24. The optoelectronic module of claim 19, further comprising one or more optical lenses interposed between said optical device and said optical reflector.

25. The optoelectronic module of claim 24, wherein said one or more optical lenses comprise a convergent lens.

26. The optoelectronic module of claim 24, wherein said one or more optical lenses comprise a divergent lens.

27. The optoelectronic module of claim 24, wherein said one or more optical lenses and said optical reflector are formed as different surfaces of a unitary optical element of light transmitting material.

28. The optoelectronic module of claim 27, wherein said unitary optical element has a lenticular top surface and an internally reflecting bottom surface.

29. The optoelectronic module of claim 19, wherein said first optical path is directed so as to enter a hole in said main circuit board in a mounted condition of said unit and said optical reflector is arranged so as to direct said second optical path towards a side wall of said hole.

30. The assembly of claim 19, further comprising a substrate to which said optical device, said electronic circuit and said optical reflector are mounted.

31. The optoelectronic module of claim 30, wherein said substrate comprises a printed circuit interconnecting said electronic circuit and said optical device.

32. The optoelectronic module of claim 30, further comprising electrical contacts disposed on said substrate to mount and interconnect to a main circuit board.

33. The optoelectronic module of claim 32, wherein said electrical contacts are on an underside of said substrate.

34. The optoelectronic module of claim 33, wherein said electrical contacts are configured to surface-mount said unit to the said main circuit board.

35. The optoelectronic module of claim 30, wherein said electronic circuit is mounted to a top of said substrate.

36. The optoelectronic module of claim 30, wherein said substrate is a circuit board and said first optical axis is substantially perpendicular to said circuit board.

37. An optoelectronic module comprising:
   an optical device configured to emit or detect a light signal along a first optical path;
   an electronic circuit connected to supply a drive signal to said optical device or to receive a signal detected by said optical device; and an optical reflector configured to redirect said light signal substantially radially about said first optical path along a second optical path substantially transverse to said first optical path, wherein said optical device, electronic circuit and optical reflector are assembled so as to be mounted as a unit to a main circuit board, and said optical reflector is a convex reflector.

38. The optoelectronic module of claim 37, wherein said optical device comprises one or more light emitters.

39. The optoelectronic module of claim 38, wherein said one or more light emitters comprises one or more laser diodes.

40. The optoelectronic module of claim 37, wherein said optical device comprises an array of light emitters or light detectors.

41. The optoelectronic module of claim 37, wherein said optical device comprises one or more photodiodes.

42. The optoelectronic module of claim 37, further comprising one or more optical lenses interposed between said optical device and said optical reflector.

43. The optoelectronic module of claim 42, wherein said one or more optical lenses comprise a convergent lens.

44. The optoelectronic module of claim 42, wherein said one or more optical lenses comprise a divergent lens.

45. The optoelectronic module of claim 42, wherein said one or more optical lenses and said optical reflector are formed as different surfaces of a unitary optical element of light transmitting material.

46. The optoelectronic module of claim 45, wherein said unitary optical element has a lenticular top surface and an internally reflecting bottom surface.

47. The optoelectronic module of claim 37, wherein said first optical path is directed so as to enter a hole in said main circuit board in a mounted condition of said unit and said optical reflector is arranged so as to direct said second optical path towards a side wall of said hole.

48. The assembly of claim 37, further comprising a substrate to which said optical device, said electronic circuit and said optical reflector are mounted.

49. The optoelectronic module of claim 48, wherein said substrate comprises a printed circuit interconnecting said electronic circuit and said optical device.

50. The optoelectronic module of claim 48, further comprising electrical contacts disposed on said substrate to mount and interconnect to a main circuit board.

51. The optoelectronic module of claim 50, wherein said electrical contacts are on an underside of said substrate.

52. The optoelectronic module of claim 51, wherein said electrical contacts are configured to surface-mount said unit to the said main circuit board.

53. The optoelectronic module of claim 48, wherein said electronic circuit is mounted to a top of said substrate.

54. The optoelectronic module of claim 48, wherein said substrate is a circuit board and said first optical axis is substantially perpendicular to said circuit board.

55. An optoelectronic module comprising:
an optical device configured to emit or detect a light signal along a first optical path;
an electronic circuit connected to supply a drive signal to said optical device or to receive a sianal detected by said optical device; and
an optical reflector configured to redirect said light sianal substantially radially about said first optical path along a second optical path substantially transverse to said first optical path, wherein said optical device, electronic circuit and optical reflector are assembled so as to be mounted as a unit to a main circuit board, and said optical reflector is a paraboloid of revolution reflector.

56. The optoelectronic module of claim 55, wherein said optical device comprises one or more light emitters.

57. The optoelectronic module of claim 56, wherein said one or more light emitters comprises one or more laser diodes.

58. The optoelectronic module of claim 55, wherein said optical device comprises an array of light emitters or light detectors.

59. The optoelectronic module of claim 55, wherein said optical device comprises one or more photodiodes.

60. The optoelectronic module of claim 55, further comprising one or more optical lenses interposed between said optical device and said optical reflector.

61. The optoelectronic module of claim 60, wherein said one or more optical lenses comprise a convergent lens.

62. The optoelectronic module of claim 60, wherein said one or more optical lenses comprise a divergent lens.

63. The optoelectronic module of claim 60, wherein said one or more optical lenses and said optical reflector are formed as different surfaces of a unitary optical element of light transmitting material.

64. The optoelectronic module of claim 63, wherein said unitary optical element has a lenticular top surface and an internally reflecting bottom surface.

65. The optoelectronic module of claim 55, wherein said first optical path is directed so as to enter a hole in said main circuit board in a mounted condition of said unit and said optical reflector is arranged so as to direct said second optical path towards a side wall of said hole.

66. The assembly of claim 55, further comprising a substrate to which said optical device, said electronic circuit and said optical reflector are mounted.

67. The optoelectronic module of claim 66, wherein said substrate comprises a printed circuit interconnecting said electronic circuit and said optical device.

68. The optoelectronic module of claim 66, further comprising electrical contacts disposed on said substrate to mount and interconnect to a main circuit board.

69. The optoelectronic module of claim 68, wherein said electrical contacts are on an underside of said substrate.

70. The optoelectronic module of claim 69, wherein said electrical contacts are configured to surface-mount said unit to the said main circuit board.

71. The optoelectronic module of claim 66, wherein said electronic circuit is mounted to a top of said substrate.

72. The optoelectronic module of claim 66, wherein said substrate is a circuit board and said first optical axis is substantially perpendicular to said circuit board.

73. An optoelectronic module comprising:
an optical device configured to emit or detect a light signal along a first optical path;
an electronic circuit connected to supply a drive sianal to said optical device or to receive a signal detected by said optical device; and
an optical reflector configured to redirect said light signal substantially radially about said first optical path along a second optical path substantially transverse to said first optical path, wherein said optical device, electronic circuit and optical reflector are assembled so as to be mounted as a unit to a main circuit board, and said optical reflector is a paraboloid of revolution reflector.

74. The optoelectronic module of claim 73, wherein said optical device comprises one or more light emitters.

75. The optoelectronic module of claim 74, wherein said one or more light emitters comprises one or more laser diodes.

76. The optoelectronic module of claim 73, wherein said optical device comprises an array of light emitters or light detectors.

77. The optoelectronic module of claim 73, wherein said optical device comprises one or more photodiodes.

78. The optoelectronic module of claim 73, further comprising one or more optical lenses interposed between said optical device and said optical reflector.

79. The optoelectronic module of claim 78, wherein said one or more optical lenses comprise a convergent lens.

80. The optoelectronic module of claim 78, wherein said one or more optical lenses comprise a divergent lens.

81. The optoelectronic module of claim 78, wherein said one or more optical lenses and said optical reflector are formed as different surfaces of a unitary optical element of light transmitting material.

82. The optoelectronic module of claim 81, wherein said unitary optical element has a lenticular top surface and an internally reflecting bottom surface.

83. The optoelectronic module of claim 73, wherein said first optical path is directed so as to enter a hole in said main circuit board in a mounted condition of said unit and said optical reflector is arranged so as to direct said second optical path towards a side wall of said hole.

84. The assembly of claim 73, further comprising a substrate to which said optical device, said electronic circuit and said optical reflector are mounted.

85. The optoelectronic module of claim 84, wherein said substrate comprises a printed circuit interconnecting said electronic circuit and said optical device.

86. The optoelectronic module of claim 84, further comprising electrical contacts disposed on said substrate to mount and interconnect to a main circuit board.

87. The optoelectronic module of claim 86, wherein said electrical contacts are on an underside of said substrate.

88. The optoelectronic module of claim 87, wherein said electrical contacts are configured to surface-mount said unit to the said main circuit board.

89. The optoelectronic module of claim 84, wherein said electronic circuit is mounted to a top of said substrate.

90. The optoelectronic module of claim 84, wherein said substrate is a circuit board and said first optical axis is substantially perpendicular to said circuit board.

91. An optoelectronic module comprising:
an optical device configured to emit or detect a light signal along a first optical path;
an electronic circuit connected to supply a drive signal to said optical device or to receive a signal detected by said optical device;
an optical reflector configured to redirect said light signal along a second optical path substantially transverse to said first optical path; and
one or more optical lenses interposed between said optical device and said optical reflector;
said optical device, said electronic circuit and said optical reflector being assembled so as to be mounted as a unit to a main circuit board;
said one or more optical lenses and said optical reflector being formed as different surfaces of a unitary optical element of light transmitting material; and
said unitary optical element having a lenticular top surface and an internally reflecting bottom surface.

92. An optoelectronic module comprising:
an optical device configured to emit or detect a light signal along a first optical path;
an electronic circuit connected to supply a drive signal to said optical device or to receive a signal detected by said optical device;
an optical reflector formed as a surface of a unitary optical element of light transmitting material and configured to redirect said light signal substantially radially corresponding to said first optical path along a second optical path substantially transverse to said first optical path; and
one or more optical lenses formed as another surface of said unitary optical element of light transmitting material having a lenticular top surface and an internally reflecting bottom surface, and interposed between said optical device and said optical reflector,
wherein said optical device, electronic circuit and optical reflector are assembled so as to be mounted as a unit to a main circuit board.

* * * * *

UNITED STATES PATENT AND TRADEMARK OFFICE
CERTIFICATE OF CORRECTION

PATENT NO.        : 7,149,376 B2  
APPLICATION NO. : 10/814011  
DATED             : December 12, 2006  
INVENTOR(S)       : Toshi K. Uchida et al.

Page 1 of 1

It is certified that error appears in the above-identified patent and that said Letters Patent is hereby corrected as shown below:

Column 11, line 8, change "convex" to --conical--.  
Column 11, line 64, change "sianal" to --signal--.  
Column 12, line 57, change "sianal" to --signal--.  
Column 12, line 67, change "paraboloid of revolution" to --pyramidal--.

Signed and Sealed this

Twenty-sixth Day of June, 2007

JON W. DUDAS  
*Director of the United States Patent and Trademark Office*